United States Patent
Lin et al.

(10) Patent No.: US 8,738,988 B2
(45) Date of Patent: May 27, 2014

(54) DATA SENDING/RECEIVING METHOD WITH FORWARD ERROR CORRECTION AND RELATED COMPONENT AND SYSTEM FOR GIGABIT ETHERNET

(75) Inventors: Huafeng Lin, Santa Clara, CA (US); Frank J. Effenberger, Colts Neck, NJ (US); Zhishan Feng, Santa Clara, CA (US); Zhenping Wang, Shenzhen (CN)

(73) Assignee: Futurewei Technologies, Inc., Plano, TX (US)

( * ) Notice: Subject to any disclaimer, the term of this patent is extended or adjusted under 35 U.S.C. 154(b) by 352 days.

(21) Appl. No.: 13/169,476

(22) Filed: Jun. 27, 2011

(65) Prior Publication Data
US 2011/0320905 A1 Dec. 29, 2011

Related U.S. Application Data

(60) Provisional application No. 61/359,716, filed on Jun. 29, 2010, provisional application No. 61/365,844, filed on Jul. 20, 2010.

(51) Int. Cl.
| | | |
|---|---|---|
| H03M 13/00 | (2006.01) | |
| G06F 11/00 | (2006.01) | |
| H04L 1/00 | (2006.01) | |
| H03M 13/25 | (2006.01) | |

(52) U.S. Cl.
CPC .......... *H04L 1/0041* (2013.01); *H03M 13/255* (2013.01)
USPC ............................................ 714/752; 714/52

(58) Field of Classification Search
CPC ....... H04L 1/00; H04L 1/0002; H04L 1/0006; H04L 1/0033; H04L 1/0036; H04L 1/0041; H04L 1/0042; H04L 1/0057; H04L 1/0045; H04L 1/0061; H03M 13/19; H03M 13/151; H03M 13/1515; H03M 13/255
USPC ......... 714/752, 746, 753, 755–758, 781, 784, 714/786, 798–799, 712, 48, 52, 4
See application file for complete search history.

(56) References Cited

U.S. PATENT DOCUMENTS

| | | | |
|---|---|---|---|
| 6,437,892 B1 | | 8/2002 | Fang et al. |
| 7,076,724 B2 * | | 7/2006 | Cole et al. ..................... 714/784 |

(Continued)

FOREIGN PATENT DOCUMENTS

| | | |
|---|---|---|
| CN | 101369861 A | 2/2009 |
| CN | 101455019 A | 6/2009 |

OTHER PUBLICATIONS

Foreign Communication From A Related Counterpart Application, International Application No. PCT/CN2011/076545, International Search Report dated Oct. 13, 2011, 3 pages.

(Continued)

*Primary Examiner* — Christine Tu
(74) *Attorney, Agent, or Firm* — Conley Rose, P.C.; Grant Rodolph; Jonathan K. Polk

(57) ABSTRACT

A method for sending data from a transmitter to a receiver in a transmission network comprising receiving outgoing data that is eight-bits-ten-bits (8b10b) encoded at a Gigabit Ethernet (GE) line rate from a physical medium attachment (PMA) layer, 8b10b decoding the received outgoing data, 64-bits-to-66-bits (64b66b) encoding the 8b10b decoded outgoing data, forward error correction (FEC) encoding the 64b66b encoded outgoing data, and serializing and sending the 64b66b and FEC encoded outgoing data at the GE line rate to a physical medium dependent (PMD) layer.

23 Claims, 16 Drawing Sheets

(56) References Cited

U.S. PATENT DOCUMENTS

| | | | |
|---|---|---|---|
| 7,600,171 | B2 | 10/2009 | Lee et al. |
| 7,978,972 | B2 * | 7/2011 | Ohira et al. ............... 398/25 |
| 8,281,228 | B2 * | 10/2012 | Geng et al. ............... 714/798 |
| 2008/0040643 | A1 | 2/2008 | Effenberger |
| 2010/0070822 | A1 * | 3/2010 | Leung et al. ............ 714/752 |

OTHER PUBLICATIONS

"IEEE Standard for Information Technology—Telecommunications and Information Exchange Between Systems—Local and Metropolitan Area Networks—Specific Requirements, Part 3: Carrier Sense Multiple Access with Collision Detection (CSMA/CD) Access Method and Physical Layer Specifications, Section 5," IEEE 802.3-2008, Dec. 26, 2008, 615 pages.

"IEEE Standard for Information Technology—Telecommunications and Information Exchange Between Systems—Local and Metropolitan Area Networks—Specific Requirements, Part 3: Carrier Sense Multiple Access with Collision Detection (CSMA/CD) Access Method and Physical Layer Specifications, Amendment 1: Physical Layer Specifications and Management Parameters for 10 Gb/s Passive Optical Networks," IEEE 802.3av-2009, Oct. 30, 2009, 236 pages.

* cited by examiner

DATA SENDING/RECEIVING METHOD WITH FORWARD ERROR CORRECTION AND RELATED COMPONENT AND SYSTEM FOR GIGABIT ETHERNET

CROSS-REFERENCE TO RELATED APPLICATIONS

The present application claims the benefit of U.S. Provisional Patent Application No. 61/359,716 filed Jun. 29, 2010 by Frank J. Effenberger, et al. and entitled "Low Loss Polarization Independent Depolarizer" and of U.S. Provisional Patent Application No. 61/365,844 filed Jul. 20, 2010 by Frank J. Effenberger, et al. and entitled "Low Loss Polarization Independent Depolarizer," both of which are incorporated herein by reference as if reproduced in their entirety.

STATEMENT REGARDING FEDERALLY SPONSORED RESEARCH OR DEVELOPMENT

Not applicable.

REFERENCE TO A MICROFICHE APPENDIX

Not applicable.

BACKGROUND

A passive optical network (PON) is one system for providing network access over "the last mile." The PON is a point to multi-point network comprised of an optical line terminal (OLT) at the central office, an optical distribution network (ODN), and a plurality of optical network units (ONUs) at the customer premises. In some PON systems, such as Ethernet PON (EPON) systems, downstream data is broadcasted at about 1.25 Gigabits per second (Gbps) and similarly upstream data is transmitted at about 1.25 Gbps. Other PON systems include Gigabit PON (GPON) systems, where downstream data is broadcasted at about 2.5 Gbps but upstream data is transmitted at about 1.25 Gbps. The bandwidth capability of the PON systems is expected to increase as the demands for services increase. To meet the increased demand in services, some emerging PON systems, such as Next Generation Access (NGA) systems, are being reconfigured to transport the data frames with improved reliability and efficiency and at higher bandwidths, for example at about ten Gbps, or with improved wavelength resource efficiency, for example the data frames are carried in different wavelengths by wavelength division multiplexing technologies.

SUMMARY

In one embodiment, the disclosure includes a method for sending data from a transmitter to a receiver in a transmission network comprising receiving outgoing data that is eight-bits-ten-bits (8b10b) encoded at a Gigabit Ethernet (GE) line rate from a physical medium attachment (PMA) layer, 8b10b decoding the received outgoing data, 64-bits-to-66-bits (64b66b) encoding the 8b10b decoded outgoing data, forward error correction (FEC) encoding the 64b66b encoded outgoing data, and serializing and sending the 64b66b and FEC encoded outgoing data at the GE line rate to a physical medium dependent (PMD) layer.

In another embodiment, the disclosure includes a method for receiving data sent from a transmitter to a receiver in a transmission network comprising receiving data at a GE line rate from a PMD layer, FEC decoding the received data, 64b66b decoding the FEC decoded data, 8b10b encoding the 64b66b decoded data, and serializing and sending the 8b10b encoded data at the GE line rate to a PMA layer.

In another embodiment, the disclosure includes a method for sending data from a transmitter to a receiver in a transmission network comprising receiving outgoing data that is 8b10b encoded at a GE line rate from a PMA layer, 8b10b decoding the received outgoing data, FEC encoding the 8b10b decoded outgoing data, scrambling the FEC encoded outgoing data, and serializing and sending the FEC and scramble encoded outgoing data at the GE line rate to a PMD layer.

In another embodiment, the disclosure includes a method for receiving data sent from a transmitter to a receiver in a transmission network comprising receiving data at a Gigabit Ethernet line rate from a PMD layer, descrambling the received data, FEC decoding the received data, 8b10b encoding the FEC decoded data, and serializing and sending the 8b10b encoded data at the GE line rate to a PMA layer.

In another embodiment, the disclosure includes a network component of a physical coding sublayer for GE comprising a first receiver configured to receive GE data with a first line coding at a first data rate via a PMA interface, a first processor configured to decode the GE data at the first line coding, a second processor configured to encode the decoded GE data with a FEC coding and a second line coding that has lower redundancy than the first line coding, a first transmitter configured to transmit the GE data with the FEC coding and the second line coding at the same first data rate to a PMD component via the PMA interface, a second receiver configured to receive a GE data with the first data rate, the second line coding, and the FEC coding from the PMD component via a PMA interface, a third processor configured to decode GE data at the FEC coding and the second line coding, a fourth processor configured to encode the decoded GE data with the first line coding that has higher redundancy than the second line encoding, and a second transmitter configured to transmit the GE data with first line coding at the first data rate to a PMA component via a PMA interface.

In yet another embodiment, the disclosure includes a point-to-point (P2P) GE transmission apparatus comprising a host GE device comprising a plurality of components for MAC, reconciliation, physical coding sublayer (PCS), and PMA functions, link establishment, management, and monitoring function, and related services configuration functions, and a FEC/PCS component comprising a first receiver configured to receive GE data with a first line coding at a first data rate via a PMA interface, a first processor configured to decode the GE data at the first line coding, a second processor configured to encode the decoded GE data with a FEC coding and a second line coding that has lower redundancy than the first line coding, a first transmitter configured to transmit the GE data with the FEC coding and the second line coding at the same first data rate to a PMD component via the PMA interface, a second receiver configured to receive a GE data with the first data rate, the second line coding, and the FEC coding from the PMD component via a PMA interface, a third processor configured to decode GE data at the FEC coding and the second line coding, a fourth processor configured to encode the decoded GE data with the first line coding that has higher redundancy than the second line encoding, and a second transmitter configured to transmit the GE data with first line coding at the first data rate to a PMA component via a PMA interface.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

A WDM PON system may become more attractive as a relatively high bandwidth, high security, and robust optical access system for operators. WDM PON systems may use colorless lasers to provide multiple point-to-point communication channels in single fiber. Proposed colorless laser systems may comprise seed injected lasers, such as using injection locked Fabry Perot (FP) laser diodes (LDs), reflective semiconductor optical amplifiers (RSOAs), wavelength reuse, self-seeded RSOAs, or other injection technologies. However, current colorless lasers are facing challenges in both performance and cost. From a performance aspect, to satisfy error free transmission requirement, a substantially high injection power and a well designed FP LDs or RSOAs may be required, which may lead to relatively high system cost.

Recently, efforts have been spent to study the system's optical layer and improvements have been made to colorless laser systems. However, achievements and improvements in the optical layer may not be proportional to the amount of efforts spent due to fundamental limitations of optical components. Thus, improving electrical processing has been investigated as an alternative and an efficient approach to improve the system performance and alleviate the optical layer limitations of colorless lasers.

A WDM PON may be similar to a P2P GE system in logic. However, in a P2P GE system, each GE communication channel may be carried by a separate fiber, while in a WDM PON, a plurality of P2P GE communication channels may be carried by different wavelengths on a single fiber, e.g., using wavelength division multiplexing technologies. As such, a WDM PON may comprise a plurality of logical or virtual P2P GE channels.

Figure 1A:
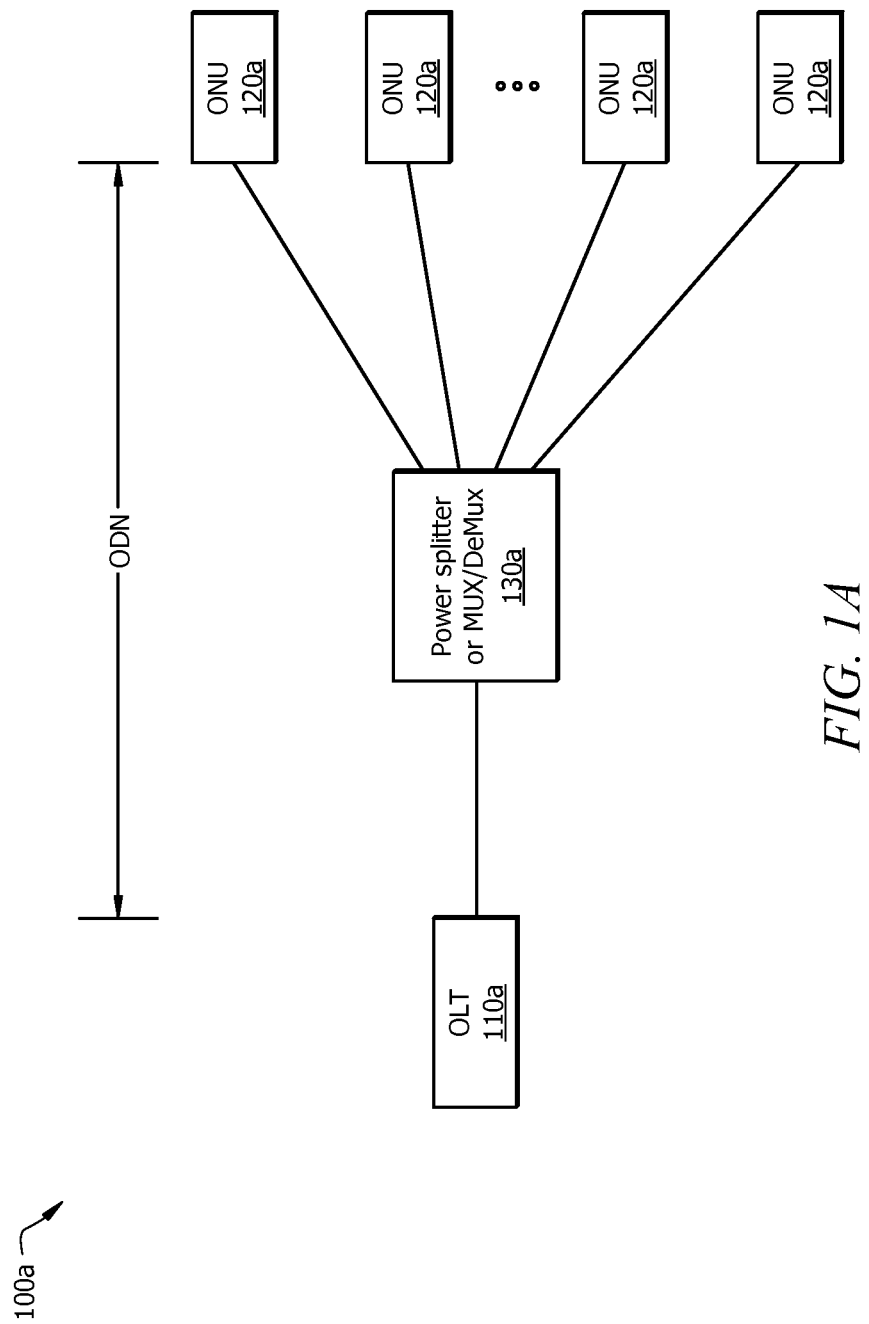
FIG. 1A is a schematic diagram of an embodiment of a typical PON.

FIG. 1A illustrates an embodiment of a typical PON 100A. The PON 100A may comprise an OLT 110A, a plurality of ONUs 120A, and an ODN 130A, which may be coupled to the OLT 110A and the ONUs 120A. The PON 100A may be a communications network that does not require any active components to distribute data between the OLT 110A and the ONUs 120A. Instead, the PON 100A may use the passive optical components in the ODN 130A to distribute data between the OLT 110A and the ONUs 120A. Examples of the PON 100A include the asynchronous transfer mode PON (APON) and the broadband PON (BPON) defined by the International Telecommunication Union Telecommunication Standardization Sector (ITU-T) G.983 standard, the GPON defined by the ITU-T G.984 standard, the Ethernet PON (EPON) defined by the Institute of Electrical and Electronics Engineers (IEEE) 802.3ah standard, the 10 Gigabit EPON as described in the IEEE 802.3av standard, and the Wavelength Division Multiplexed (WDM) PON (WPON), all of which are incorporated herein by reference as if reproduced in their entirety.

The OLT 110A may be any device that is configured to communicate with the ONUs 120A and another network (not shown). Specifically, the OLT 110A may act as an intermediary between the other network and the ONUs 120A. For instance, the OLT 110A may forward data received from the network to the ONUs 120A, and forward data received from the ONUs 120A onto the other network. Although the specific configuration of the OLT 110A may vary depending on the type of PON 100A, in an embodiment, the OLT 110A may comprise a transmitter and a receiver. When the other network is using a network protocol, such as Ethernet or Synchronous Optical Networking (SONET)/Synchronous Digital Hierarchy (SDH), that is different from the PON protocol used in the PON 100A, the OLT 110A may comprise a converter that converts the network protocol into the PON protocol. The OLT 110A converter may also convert the PON protocol into the network protocol. The OLT 110A may be typically located at a central location, such as a central office, but may be located at other locations as well.

The ONUs 120A may be any devices that are configured to communicate with the OLT 110A and a customer or user (not shown). Specifically, the ONUs 120A may act as an intermediary between the OLT 110A and the customer. For instance, the ONUs 120A may forward data received from the OLT 110a to the customer, and forward data received from the customer onto the OLT 110A. Although the specific configuration of the ONUs 120a may vary depending on the type of PON 100A, in an embodiment, the ONUs 120A may comprise an optical transmitter configured to send optical signals to the OLT 110A and an optical receiver configured to receive optical signals from the OLT 110A. Additionally, the ONUs 120A may comprise a converter that converts the optical signal into electrical signals for the customer, such as signals in the Ethernet protocol, and a second transmitter and/or receiver that may send and/or receive the electrical signals to a customer device. In some embodiments, ONUs 120A and optical network terminals (ONTs) are similar, and thus the terms are used interchangeably herein. The ONUs 120A may be typically located at distributed locations, such as the customer premises, but may be located at other locations as well.

The ODN 130A may be a data distribution system, which may comprise optical fiber cables, couplers, WDM filters, splitters, distributors, and/or other equipment. The optical fiber cables, couplers, WDM filters, splitters, distributors, and/or other equipment may be passive optical components. Specifically, the optical fiber cables, couplers, WDM filter, splitters, distributors, and/or other equipment may be components that do not require any power to distribute data signals between the OLT 110A and the ONUs 120A. Alternatively, the ODN 130 may comprise one or a plurality of processing equipment, such as optical amplifiers. The ODN 130A may typically extend from the OLT 110A to the ONUs 120A in a branching configuration as shown in FIG. 1A, but may be alternatively configured in any other point-to-multi-point configuration. The ODN 130A may comprise a multiplexer (MUX)/demultiplexer (DeMUX) that splits combined downstream channels from the OLT 110A into a plurality of separate downstream channels to the corresponding ONUs 120A, and combine a plurality of upstream signs from the ONUs 120A into a combined upstream signals to the OLT 110A.

Figure 1B:
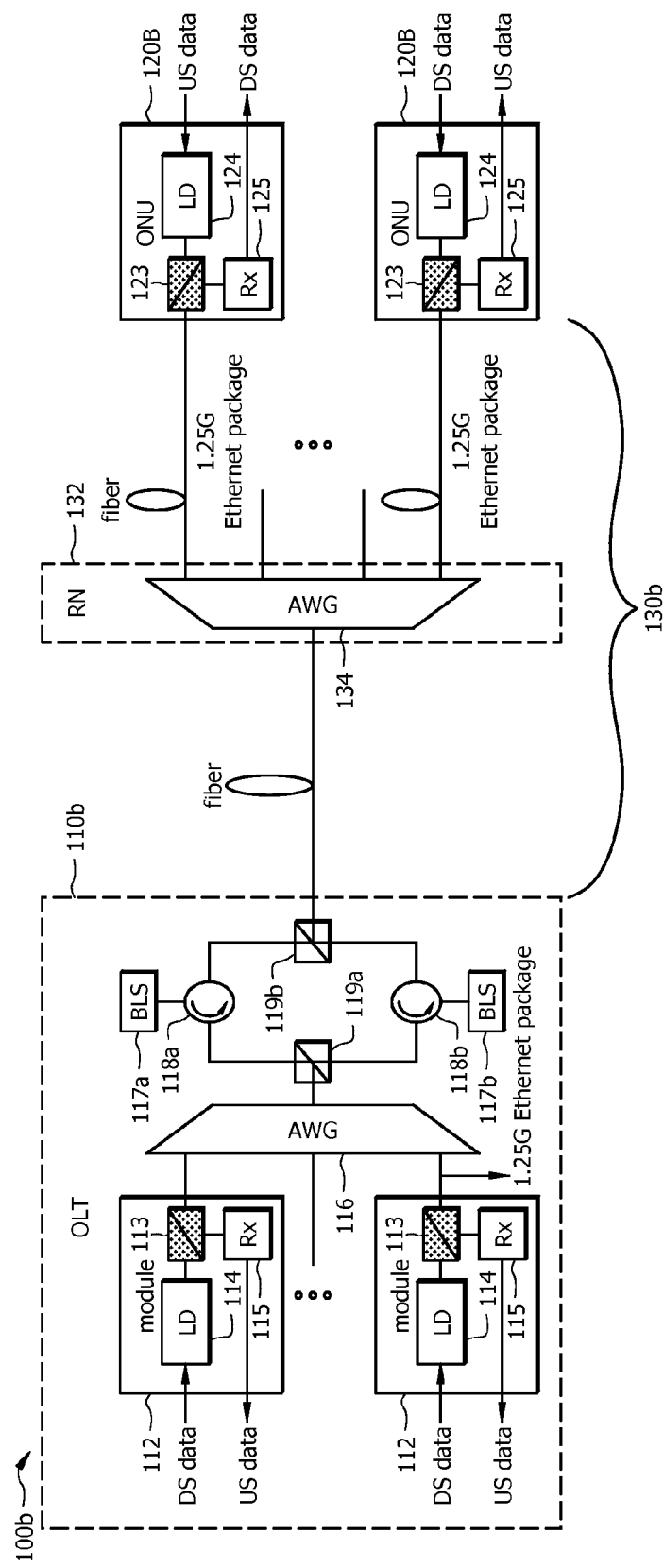
FIG. 1B is a schematic diagram of an embodiment of a typical wavelength division multiplexing (WDM) PON.

FIG. 1B illustrates an embodiment of a typical WDM PON 100B, which may be currently used. The WDM PON 100B may comprise an OLT 110B, a plurality of ONUs 120B, and an ODN 130B, which may be configured similar to the OLT 110A, the ONUs 120A, and the ODN 130A, respectively. The OLT 110B may comprise a plurality of optical modules 112, an arrayed waveguide grating (AWG) 116, one or more broad light sources (BLSs) 117, one or more circulators 118, and one or more WDM filters 119. The optical modules 112 may handle a plurality of communications channels, e.g., P2P GE communication channels, for a plurality of ONUs 120B, and may each comprise a transmitter and a receiver. The different communication channels may comprise upstream and downstream channels, where each optical module 112 may send/receive the corresponding downstream/upstream channels at different wavelengths. The optical modules 112 may also convert optical signals into electrical signals (for upstream channels) and convert electrical signals into optical signals (for downstream channels).

Each optical module 112 may comprise an internal WDM filter 113, an injected laser 114 (e.g. a FP LD or RSOA) that acts as a transmitter for downstream (DS) data, and a receiver (Rx) 115 that receives upstream data. For instance, the downstream and upstream data may comprise Ethernet packets that may be transported at about 1.25 Gbps. The components of the optical modules 112 may be configured as shown in FIG. 1B. The internal WDM filters 113 may be any optical device configured to direct incoming light that corresponds to upstream channels towards the receivers 115, incoming seed light from the BLSs 117 towards the injected lasers 114, and outgoing light that correspond to downstream channels towards the AWG 116.

The AWG 116 may be a multiplexer/demultiplexer that combines the different downstream channels (that carry downstream data) from the optical modules 112 into a combined downstream channel that is transported via the ODN 130. The AWG 116 may also split a combined upstream channel (that carries upstream data) transported from the ODN 130 into a plurality of upstream channels that correspond to the optical modules 112.

In the downstream direction (from OLT 110B to ONU 120B direction), the BLSs 117a may be high power and flat broadband light sources that provide seed light to the injected lasers 114. The circulator 118a may be any optical devices configured to direct the seed light from the BLSs 117a towards the optical modules 112 in the OLT 110B via the AWG 116 and the output light from the optical modules 112, which may be combined and coupled using the AWG 116 to the ONUs 120B via the WDM filter 119a, circulator 118a, WDM filter 119b and ODN 130B.

In the upstream direction (from ONU 120B to OLT 110B), the BLSs 117b may be high power and flat broadband light sources that provide seed light to the injected lasers 124 via the circulator 118b, WDM filter 119b, and ODN 130B. Meanwhile the WDM filters 119b may be configured to direct upstream channels from the ODN 130B towards the optical modules 112 via the circulator 118b, WDM filter 119a and AWG 116.

The ONUs 120B may each comprise optical module components including a WDM filter 123, an ONU injected laser 124 (e.g. a FP LD or RSOA) that acts as a transmitter for upstream data, and an ONU receiver 125 that receives downstream data. The optical module components of the ONUs 120B may be configured similar to the corresponding components of the optical modules 112 in the OLT 110B. The WDM filter 123 may be any optical device configured to direct incoming light that corresponds to downstream data towards the ONU receiver 125, incoming seed light from the ODN 130B towards the ONU injected laser 124, and outgoing light that correspond to upstream data towards the ODN 130B. The optical module components of each ONU 120 may communicate with a corresponding optical module 112 in the OLT 110B using a corresponding communication protocol, such as a P2P GE protocol.

The ODN 130B may comprise an ODN multiplexer/demultiplexer 132 (e.g., an AWG) that splits the combined downstream channels from a fiber coupled to the OLT 110B into a plurality of separate downstream channels that are forwarded, via separate fibers, to the corresponding ONUs 120B. The ODN multiplexer/demultiplexer 132 may also combine the upstream signals from the different ONUs 120 into a combined upstream signal that is forwarded via the fiber to the OLT 110B.

Figure 2:
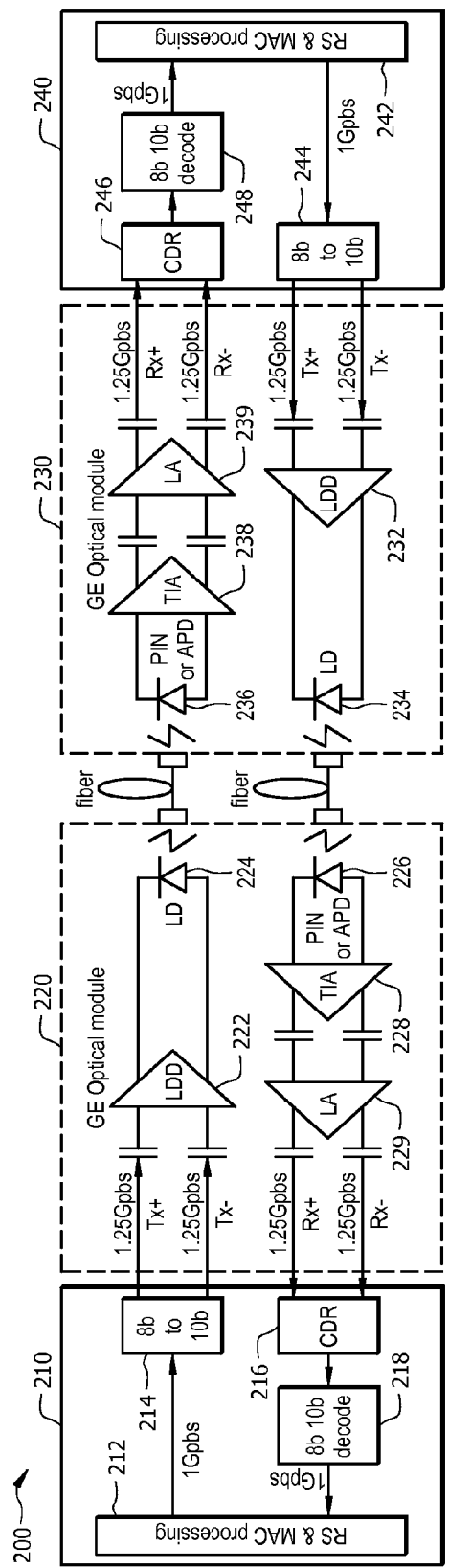
FIG. 2 is a schematic diagram of an embodiment of a point-to-point GE communication system.

FIG. 2 illustrates an embodiment of a P2P GE communication system 200, which may be currently used. At the OLT, the P2P GE communication system 200 may comprise a first signal processing module 210 and a first GE optical module 220. At the ONU, the P2P GE communication system 200 may comprise a second GE optical module 230 and a second signal processing module 240.

The first signal processing module 210 may comprise electrical signal processing components that include a Reconciliation Sub-layer (RS) and Media Access Control (MAC) processing unit 212, an 8b10b encoder 214, a Clock Data Recovery (CDR) module 216, and an 8b10b decoder 218. The components of the first signal processing module 210 may be arranged as shown in FIG. 2. The RS and MAC processing unit 212 may be configured to process the protocol function of MAC and RS sub-layer. The 8b10b encoder 214 may be configured to transform 1 Gbps data stream from RS sublayer to 1.25 Gbps 8b10b format data stream to achieve better direct current (DC) balance. The downstream data may then be transmitted, e.g., after passing by serializer (Se)/deserializer (Des) of PMA sublayer. The CDR module 216 may be configured to perform clock and bit data recovery operation from received electrical signal from a PMD sublayer. The 8b10b decoder 218 may be configured to decode received data in 8b10b format for further processing at the RS and MAC processing unit 212, and remove the overhead of 8b10b line coding.

The first GE optical module 220 may comprise electrical/optical signal processing components that include a LD driver (LDD) 222, a LD 224, a positive intrinsic negative (PIN) diode or an avalanche photodiode (APD) 226, a trans-impedance amplifier (TIA) 228, and a limited amplifier (LA) 229. The components of the first GE optical module 220 may be arranged as shown in FIG. 2. The LDD 222 may be configured to convert the high/low logical level of data transmitted from the first signal processing module 210 into a physical high/low electrical level. The LD 224 may be configured to convert the physical high/low electrical level into a physical high/low optical power signal and transmit the signal into a fiber downstream to the ONU. The PIN diode or ADP 226 may be configured to receive a high/low optical power signal for upstream data, e.g., from a second fiber, from the ONU, and convert the high/low optical power signal into high/low electrical current signal. The TIA 228 and LA 229 may then amplify and forward the high/low electrical signal to the first signal processing module 210 for further data recovery and protocol processing.

The second GE optical module 230 may comprise optical signal processing components that include an ONU LDD 232, an ONU LD 224, an ONU PIN diode or APD 236, an ONU TIA 238, and an ONU LA 239, which may be configured and arranged substantially similar to the corresponding components of the first GE optical module 220. However, the components of the second GE optical module 230 may handle the upstream and downstream signals in reverse to the first GE optical module 220.

The second signal processing module 240 may comprise electrical signal processing components that include an ONU RS and MAC processing unit 242, an ONU 8b10b encoder 244, an ONU CDR module 246, and an ONU 8b10b decoder 248, which may be configured and arranged substantially similar to the corresponding components of the first signal processing module 210. However, the components of the second signal processing module 240 may handle the upstream and downstream signals in reverse to the first signal processing module 210.

Figure 3:
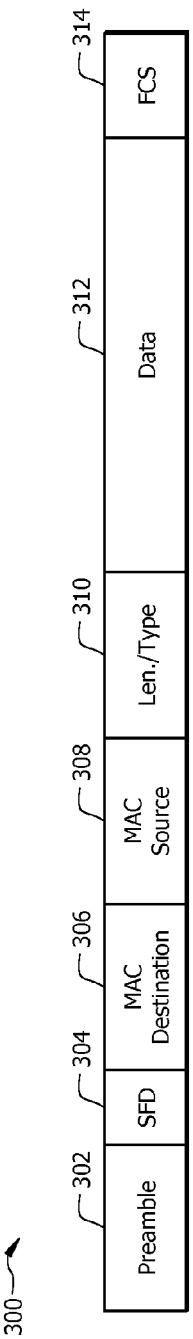
FIG. 3 is a schematic diagram of an embodiment of an Ethernet frame.

FIG. 3 illustrates an embodiment of an Ethernet packet or frame 300, which may be based on IEEE standard 802.3, which is incorporated herein by reference. The Ethernet frame 300 may be transported in a P2P GE communication channel, such as in the P2P GE communication system 200 or in the PON 100B. The Ethernet frame 300 may comprise a Preamble 302, a start frame delimiter (SFD) 304, a MAC destination address 306, a MAC source address 308, a length/type field 310, data or payload 312, and a frame check sequence (FCS) 314, which may be configured as described in IEEE 802.3. For Fast Ethernet (FE) at about 125 Megabits per second (Mbps), the standard Ethernet format may not comprise I-EC information or support I-EC. Thus, the Ethernet frame 300 may not be protected by the FEC scheme.

Figure 4:
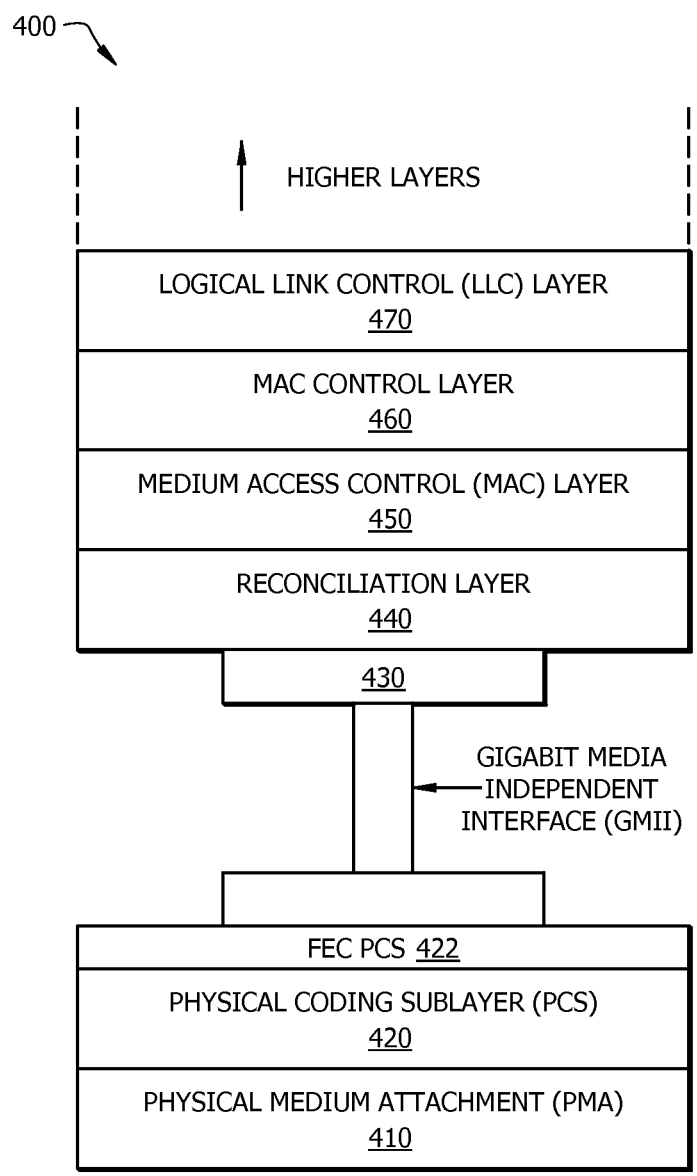
FIG. 4 is a schematic diagram of an embodiment of GE protocol layers with FEC.

FIG. 4 illustrates an embodiment of GE protocol layers 400 with FEC, which may be used in current networks. The GE protocol layers 400 may be similar to the GE protocol layers described in U.S. Pat. No. 7,343,540 published Mar. 11, 2008 by L. Khermosh, et al. and entitled "Forward Error Correction Coding in Ethernet Networks," which is incorporated herein by reference. The GE protocol layers may comprise a PMA sublayer 410, a physical coding sublayer (PCS) sublayer 420, a FEC PCS layer 422, a reconciliation layer 440, a MAC layer 450, a MAC control layer 460, a logical link control (LLC) layer 470, and other higher layers. The GE protocol layers 400 may be arranged as shown in FIG. 4. The reconciliation layer (or RS) 440 may be coupled to the I-EC PCS layer 422 via a Gigabit Media Independent Interface (GMII). The layers and sublayers may be configured as described in U.S. Pat. No. 7,343,540.

Specifically, the FEC PCS layer 422 may be added to a legacy PCS 420 and other basic layers, which may be specified in IEEE 802.3 specification, which is incorporated herein by reference. At the FEC PCS layer 422, FEC coding may be processed above the PCS 420, where a physical coding (e.g., 8b10b in 1000BaseX) may be used to maintain PMD modulation coding function and backward compatibility of the transmitted packets with other GE network devices without FEC processing capability. Since FEC encoding may decrease the payload rate of encoded packets, both transmitter and receiver may have rate adaptation mechanisms to match corresponding MAC/RS rates. Actual code rate loss may depend on the packet length and the FEC code.

Figure 5:
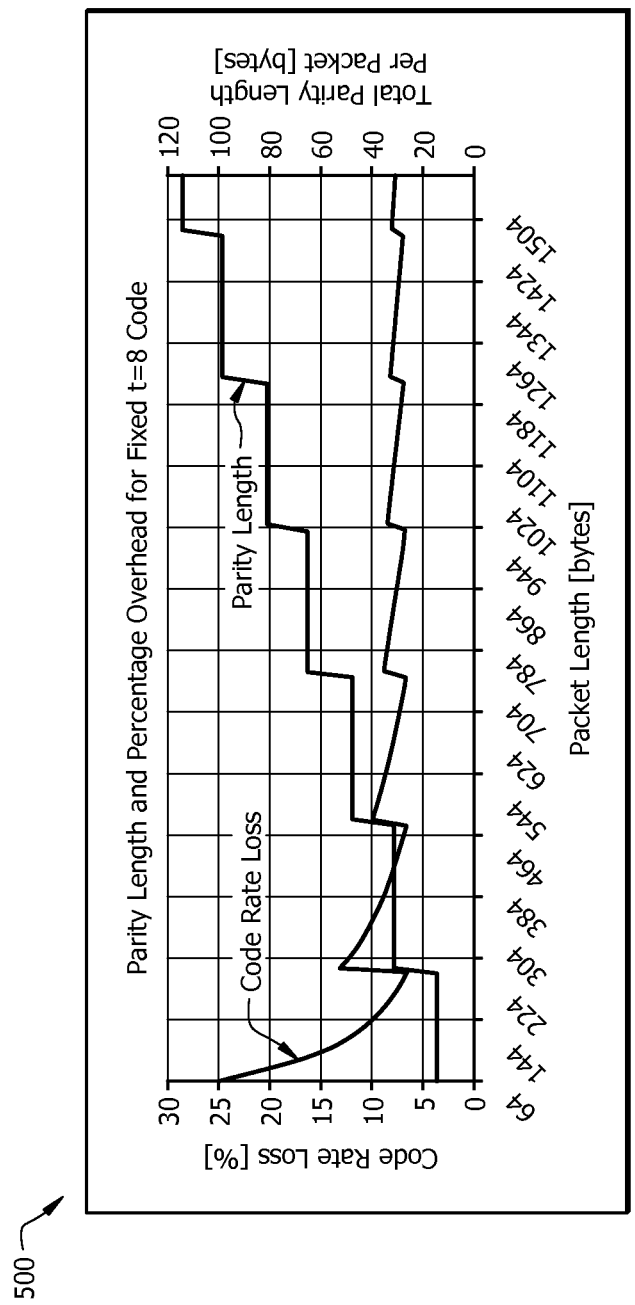
FIG. 5 is a chart of an embodiment of a code rate loss for the GE protocol layers with FEC in FIG. 4.

FIG. 5 shows a code rate loss 500 for the GE protocol layers 400 with FEC in FIG. 4. The code rate loss 500 may be introduced by the FEC code, e.g., at the FEC PCS 422. The code rate loss is shown as percentage overhead for fixed t=8 code, at a plurality of packet lengths that range from about 64 bytes to about 1504 bytes. FIG. 5 also shows the corresponding total parity length per packets (in bytes) at the range of packet lengths. The code rate loss shows that the FEC coding introduces substantial payload rate drop of encoded packets, which may be more significant for smaller size Ethernet packets. For example, for about 64 bytes sized packets, the code rate loss may be at about 25 percent. This may be one of the issues that may be resolved or improved as described below.

Figure 6:
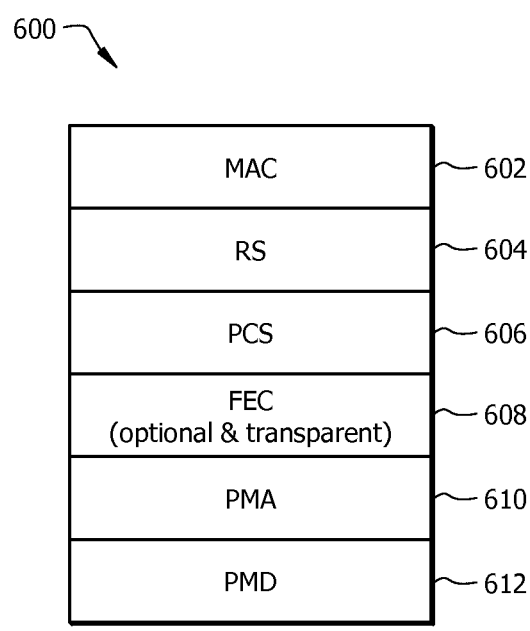
FIG. 6 is a schematic diagram of an embodiment of EPON protocol layers.

FIG. 6 illustrates an embodiment of EPON protocol layers 600, which may be used in current networks. The EPON protocol layers may include an optional and transparent FEC implementation. The EPON protocol layers 600 may be similar to the EPON protocol layers recommended in IEEE standard 802.3.3-2008, section 5, which is incorporated herein by reference. For instance, the EPON protocol layers 600 may be implemented in the PON 100B to protect Ethernet frames or packets using the FEC scheme. The FEC scheme may be a lower cost approach to improving link quality and reducing communication errors. Thus, the FEC scheme may improve the power budget/transmission distance of EPON.

The EPON protocol layers 600 may comprise a MAC layer 602, a RS layer 604, a PCS 606, an optional FEC layer 608, a PMA layer 610, and a PMD layer 612, which may be configured as described in IEEE 802.3.3-2008. The FEC layer 608 may be an optional layer that may be transparent to the MAC layer 602. Thus, the MAC layer 602 may not need to be aware as to whether the Ethernet or GE packet is FEC encoded. However, to support the FEC scheme, additional FEC parity may be added to the transmitted bits stream at the expense of Ethernet packet data or payload. Due to this FEC parity overhead, the data or payload throughput may be substantially reduced, if the overall physical line rate is maintained unchanged, e.g., at about 1.25 Gbps. Additionally, this scheme may require substantial padding of relatively small size Ethernet packets (e.g., that have packet length less than about 239 bytes), which may further reduce the data or payload throughput. In many typical applications where Ethernet packets may have lengths less than about 239 bytes, the efficiency of the FEC scheme may be substantially low.

Figure 7:
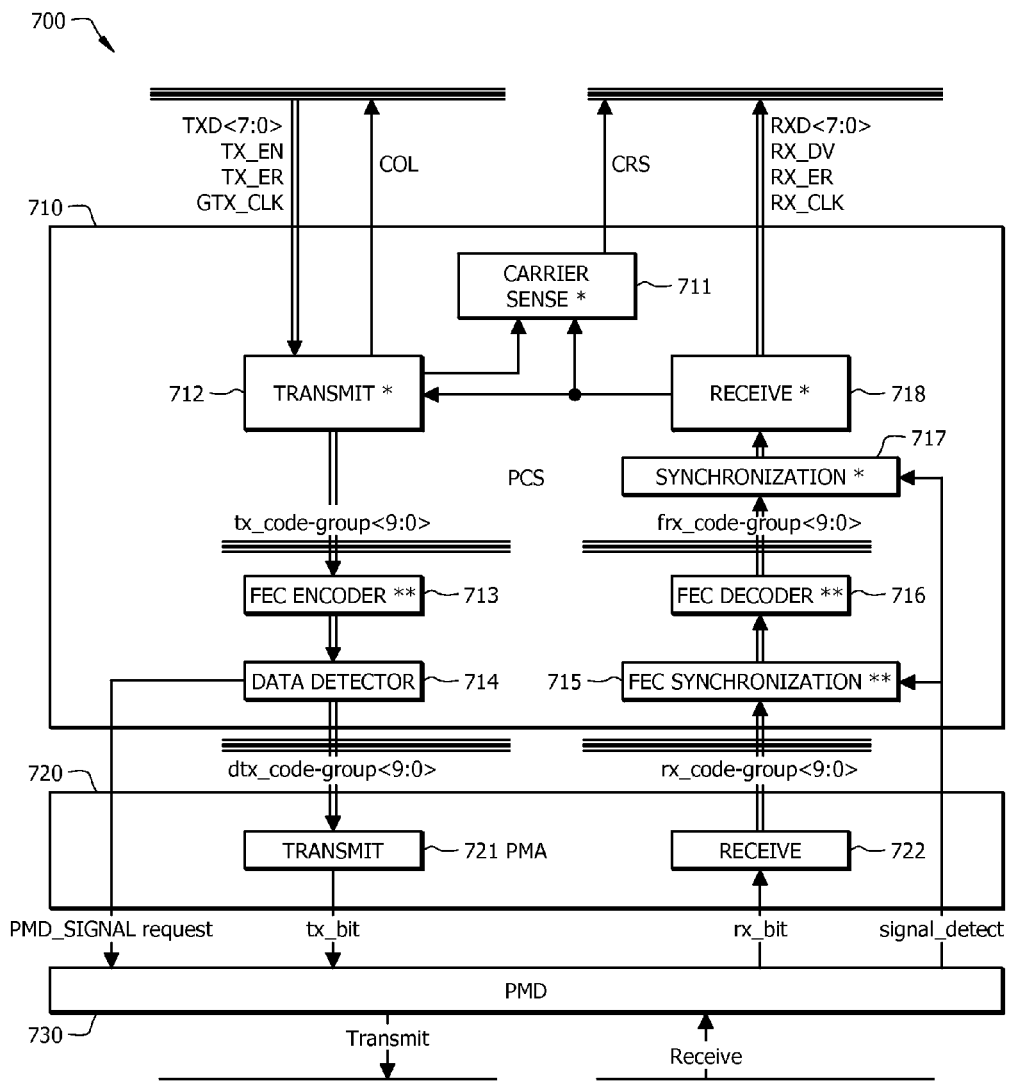
FIG. 7 is a schematic diagram of an embodiment of an EPON FEC scheme.

FIG. 7 illustrates an embodiment of an EPON FEC scheme 700, which may be used in current networks. The EPON FEC scheme 700 may support the EPON protocol layers 600 including the FEC scheme as described in clause 65.2 of 802.3-2008_section 5, which is incorporated herein by reference. At a PCS 710, outgoing data may be transmitted by a transmit module 712. FEC parity may then be added to the data at a FEC encoder 713 and sent to a second transmit module 721 at a PMA layer 720. A Data Detector 714 may comprise a delay line (using a first in first out (FIFO) buffer) for storing code-groups to be transmitted. The length of the FIFO buffer may be selected such that the delay introduced by the buffer in addition to any delay introduced by the PMA layer 720 is long enough to turn the laser on and to allow a predefined number of idle characters to be transmitted. A second transmit module 721 may then send the data to the PMD layer 730 for optical transmission. At the PMD layer 730 incoming data may also be received and forwarded to a receive module 722 at the PMA layer 720. The data may then be forwarded to a FEC synchronization module 715 and then a FEC decoder 716 in the PCS 710. The FEC decoder 716 may then send the data to a synchronization module 717, which may in turn send the data to a receive module 718 for further processing. As such, a signal_detect may be used to indicate the status of the incoming link signal.

The functions of the components and modules in the EPON FEC scheme 700 may be implemented using hardware. As shown in FIG. 7, the FEC processing may be implemented between the PCS 710 and the PMA layer 720. The EPON FEC scheme 700 based on the EPON protocol layers 600 may have substantially reduced data throughput or data rate of MAC/RS to less than about 1 Gbps since FEC parity may have to sacrifice the data throughput of MAC/RS when about 1.25 Gbps of physical line rate is fixed. For Ethernet packets that have lengths less than about 256 bytes, the data throughput may be reduced by about 35 percent due to FEC protection. Additionally, the EPON FEC scheme 700 may not be applicable for standard P2P GE transmission since the EPON FEC scheme 700 is designed for an EPON MAC that is different from a standard GE MAC.

Figure 8:
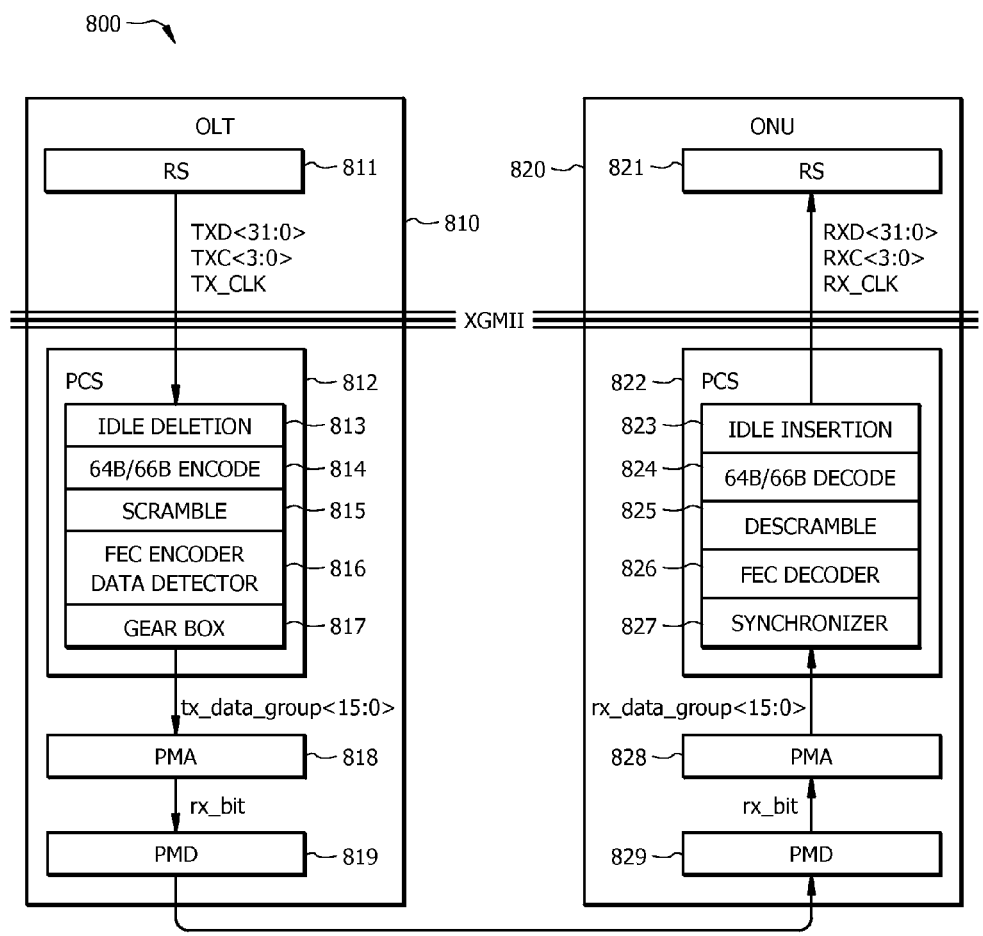
FIG. 8 is a schematic diagram of an embodiment of a 10 Gigabit (10 G) EPON FEC scheme.

FIG. 8 illustrates another prior-art embodiment of 10 G EPON FEC scheme 800. The 10 G EPON FEC scheme 800 is described in IEEE standard 802.3av-2009, which is incorporated herein by reference. The 10 G EPON FEC scheme 800 is shown in the downstream direction from an OLT 810 to an ONU 820. At the OLT 810, the FEC processing is implemented in a PCS 812. The RS layer 811 forwards downstream data to an idle deletion module 813 of the PCS 812. The data may then be forwarded and processed through a 64b66b (or 64B/66B) encode module 814, a scramble module 815, a FEC encoder and data detector 816, and a gear box 817. The data may then be sent to a PMA layer 818 and subsequently to a PMD layer 819 before being transported via a fiber to the ONU 820.

At the ONU 820, an ONU PMD layer 829 receives the downstream data from the OLT 810 and sends the data to an ONU PMA layer 828. The data may then be forwarded to a synchronizer 827 at an ONU PCS 822 (including a FEC decoder 826, a descrambler 825, a 64B/66B decode module 824, and an idle insertion module 823, in that order). The data may then be sent to an ONU RS layer 821. As shown in FIG. 8, the FEC processing may be implemented in the PCS 812 of the OLT 810 and the ONU PCS 822. Specifically, the 10 G EPON FEC scheme 800 may be designed for data rates of about 10.3125 Gbps and a corresponding 64b66b line coding scheme, which may not be compatible with the P2P GE and corresponding 8b10b line coding scheme. Thus, the 10 G EPON FEC scheme 800 may be suitable for 10 G EPON systems but not P2P GE.

Disclosed herein is a data sending/receiving method, component, and related transmission system for GE with FEC correction capability. The disclosed data sending/receiving method and component may be compatible with standard legacy GE equipments, legacy GE MAC chips, and legacy GE PMA interfaces. The disclosed data sending/receiving method and component may allow the legacy GE device and network systems to extend the transmission distance without the need for using higher quality and higher cost laser, and without introducing any extra data rate or sacrificing payload rate.

Figure 9:
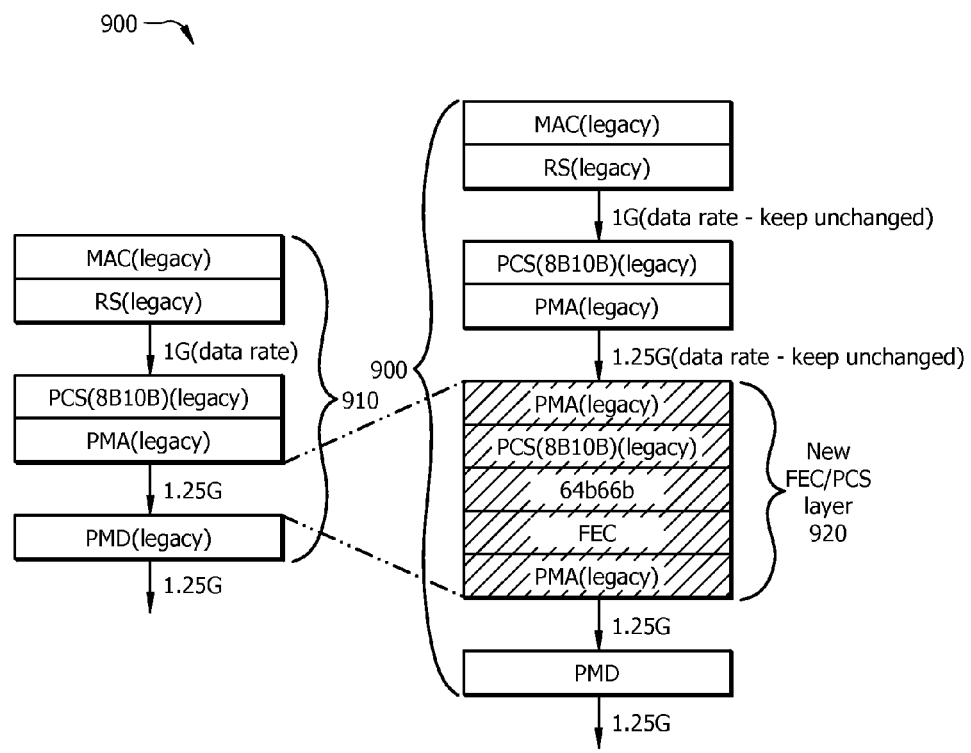
FIG. 9 is a schematic diagram of an embodiment of a GE data sending/receiving scheme with improved FEC.

FIG. 9 illustrates an embodiment of a GE data sending/receiving scheme 900 with improved FEC capability in comparison to the schemes and protocols described above. FIG. 9 also shows legacy standard GE protocol layers 910, including MAC, RS, PCS (with 8b10b encoding/decoding), PMA, and PMD. In the GE protocol layers 910, a GMII interface may be used between the RS layer and PCS layer that is designed to provide an 8-bits wide data path (e.g., at about 1000 Mbps or about 1 Gbps data rate or payload rate) between the MAC layer and the physical (PHY) layers (including PCS, PMA and PMD). The data from RS may be 8b10b encoded (e.g., 8-bits blocks are converted into 10-bits block) in PCS, which results in a data rate of about 1250 Mbps (e.g., the encoded data rate may be 1000 Mbps×10/8=1250 Mbps). Subsequently, the 8b10b encoded data is serialized in the PMA layer, and transmitted in the PMD layer.

The GE data sending/receiving scheme 900 with improved FEC may comprise similar layers as the legacy standard GE protocol layers 910. However, the GE data sending/receiving scheme 900 may also comprise a new FEC/PCS layer 920 that may be added between the legacy PMA and PMD layers. The new FEC/PCS layer 920 may comprise a plurality of layers, including legacy PMA, legacy PCS (with 8b10b encoding/decoding), 64b66b encoding/decoding, FEC, and legacy PMA, arranged as shown in FIG. 9. As such, the new FEC/PCS layer 920 may be configured to receive 8b10b encoded data (at about 1.25 Gbps) from the legacy PMA above the new FEC/PCS layer 920, deserialize the data using a legacy PMA processing method, and perform 8b10b decoding using a legacy PCS processing method, and returning decoded data at 1 Gbps. The new FEC/PCS layer 920 may then encode the decoded data using 64b66b encoding and FEC, e.g., using Reed-Solomon FEC encoding RS (255,223) or RS (255, 239), and then deserializing the encoded data using a legacy PMA processing method. After completing the new FEC/PCS processing, the serialized data may be forward to the PMD layer for final transmission.

During the PMA and PCS processing at the new FEC/PCS layer 920, the 8b10b data encoding is deserialized and 8b10b decoded to identify packet components, such as start-of-packet delimiter (SPD), end-of-packet delimiter (EPD), data, idle, and/or other data or packet components. At the 64B66B encoding, the deserialized and 8b10b decoded data is encoded using 64B66B line coding. Replacing the 8b10b line coding (with about 20 percent overhead) with the 64b66b line coding (with about 3 percent overhead), which may have substantially lower redundancy, may spare additional space or transmission bandwidth to accommodate the added FEC parity, resulting in that the added FEC parity does not increase the physical line rate (still at about 1.25 Gbps) or sacrifice the 1 Gbps data rate or payload rate. Thus, the FEC processing in the GE data sending/receiving scheme 900 may be transparent to the legacy MAC/RS/PCS/PMA layers and may be compatible with legacy GE devices/components. FIG. 9 shows data processing method in the transmission direction. In the receiving direction, data processing procedure may be reversed.

Figure 10:
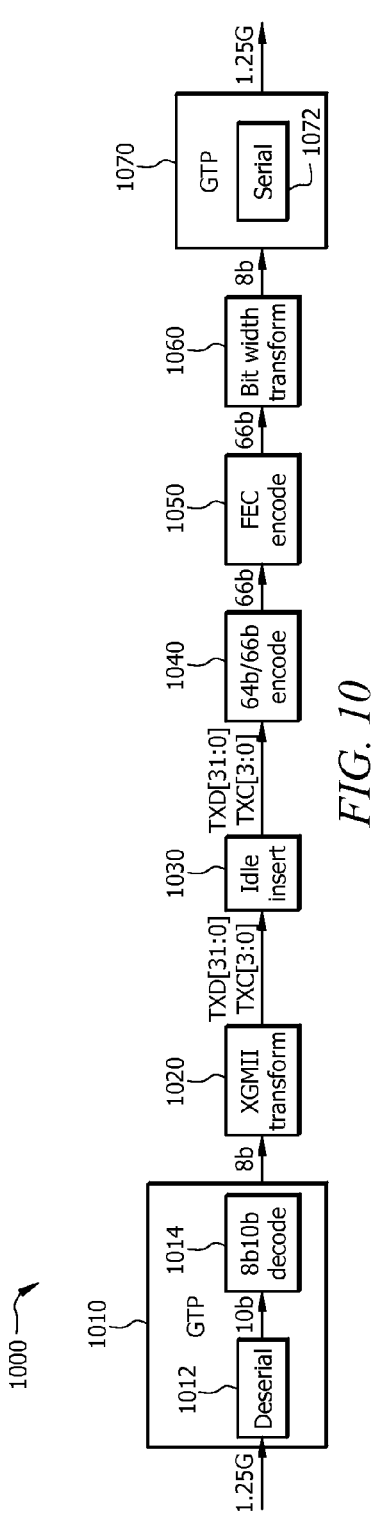
FIG. 10 is a schematic diagram of an embodiment of a data sending method.

FIG. 10 illustrates an embodiment of a data sending method 1000, which may be implemented at the new FEC/PCS layer 920. Initially, at a Gigabit Transceiver with low power (GTP) 1010, the 1.25 G GE data received from legacy standard GE PMA may be deserialized at block 1012, byte synchronized, and 8b10b decoded at block 1014. The resulting output bytes stream may undergo a 10 G GMII (XGMII) transform at block 1020, and then undergo idle insertion at block 1030 to achieve rate matching and hence insure about 1.25 G bit rate. After idle insertion, the data may be forwarded for 64b66b encoding at block 1040. In the data sending method 1000, TXD[31:0] is the 32-bits width data and TXC [3:0] is 4-bits control bits, which indicates that the corresponding bytes are data or control code. After 64b66b encoding, multiple or couple 66-bits blocks may be assembled into one payload of FEC codeword at 1050. The assembled FEC payload may be fed into a FEC encoder for parity generation. Reed-Solomon FEC coding is recommended (e.g., RS (255, 223), or RS (255, 239)). Reed-Solomon (RS) codes are one of systematic codes, and the parity symbols may appended to the end of the data payload. After FEC encoding, the FEC code word may be sent for bit width transform (where 66-bits width is transformed to 8-bits width) at block 1060. Finally, the data may be serialized and transmitted at block 1072, at a GTP 1070.

Figure 11:
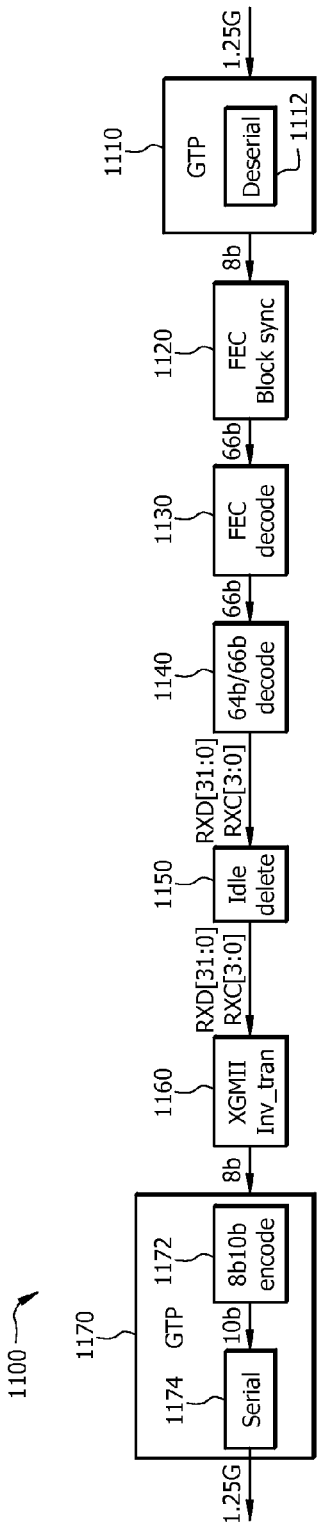
FIG. 11 is a schematic diagram of an embodiment of a data receiving method.

FIG. 11 illustrates an embodiment of a data receiving method 1100, which may be implemented at the new FEC/PCS layer 920. The data receiving method 1100 may be the reversed of the data transmission method 1000. Initially, at a GTP 1010, the received 1.25 G GE data with FEC coding may be deserialized at block 1112. The output may then be codeword synchronized for FEC at block 1120, and then FEC decoded at block 1130. Next, the data may be 64b66b decoded at block 1140, and then processed for idle deletion at block 1150. After idle deletion, the data may undergo a XGMII inverse transform at block 1160. Subsequently, the data may be 8b10b encoded at block 1172 and then serialized at block 1174, at a GTP 1170. The encoding/decoding and related synchronization of FEC codeword and 64b66b blocks in the data receiving method 1100 and the data transmission method 1000 may be based on PCS for IEEE 10 G-EPON specification in 76.3 Amendment 1: Physical Layer Specifications and Management Parameters for 10 Gb/s Passive Optical Networks of IEEE Std 802.3av™-2009, which is incorporated herein by reference.

Figure 12:
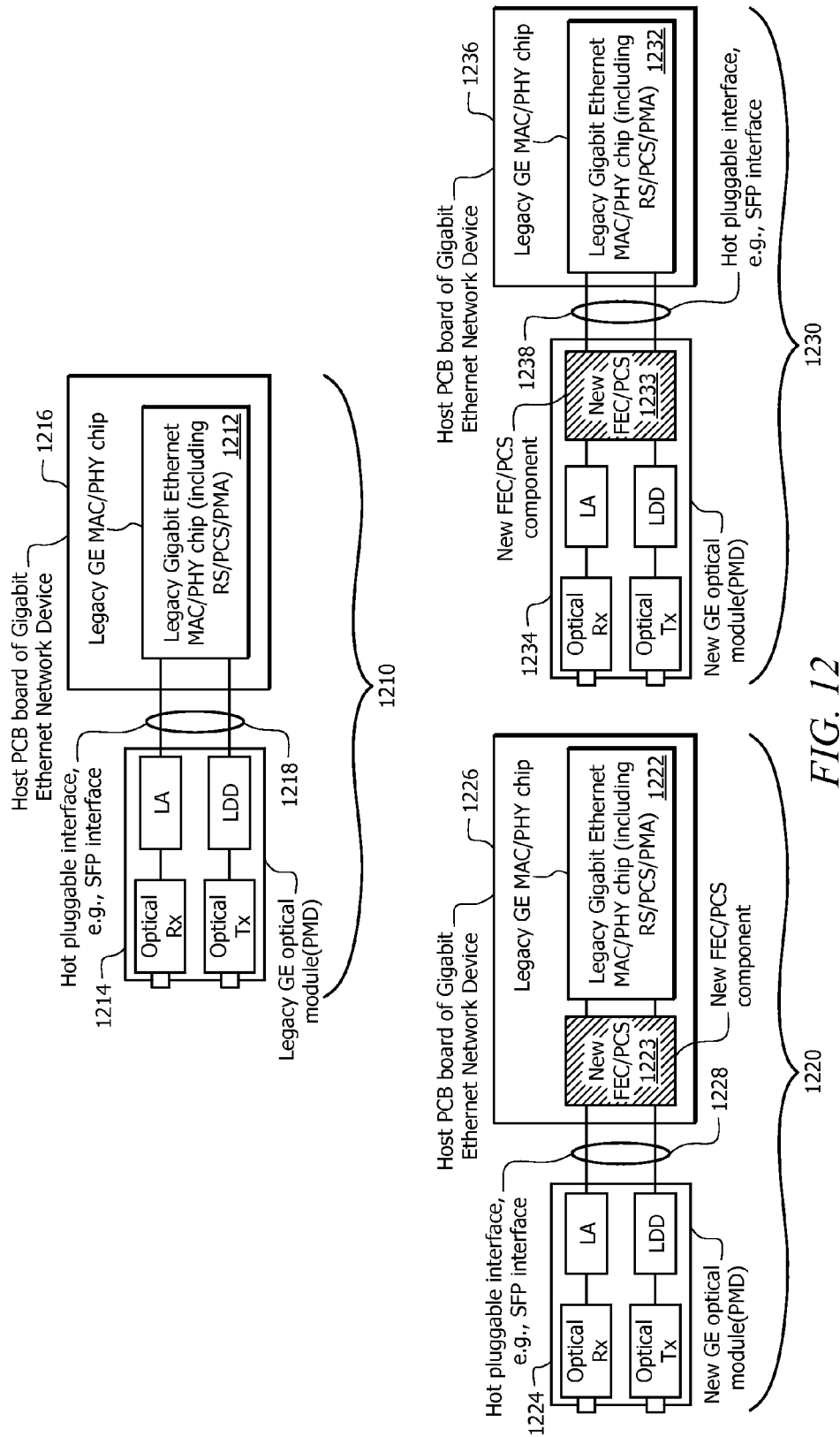
FIG. 12 is a schematic diagram of apparatus embodiments according to the data sending/receiving scheme with improved FEC in FIG. 9, FIG. 10, and FIG. 11.

FIG. 12 illustrates embodiments of two data sending/receiving apparatuses 1220 and 1230 for implementing the GE data sending/receiving scheme 900, the data sending method 1000, and the data receiving method 1100. FIG. 12 also shows a legacy data sending/receiving apparatus 1210 for implementing the legacy standard GE protocol layers 910. In the legacy standard GE protocol layers 910, the functions of legacy MAC layer, RS layer, PCS, and PMA layer are integrated/processed in a legacy GE MAC/PHY chip 1212, and the function of PMD layer is processed in a legacy GE optical module 1214. The legacy MAC/PHY chip 1212 may be located in a host PCB board of a GE network device 1216, which may be coupled to the legacy GE optical module 1214 via a hot pluggable interface (e.g., a small form-factor pluggable (SFP) interface) 1218.

In the data sending/receiving apparatus according to the data sending/receiving method 900, a new FEC/PCS component 1223 may be added and coupled to a legacy GE MAC/PHY chip 1222 in a host PCB board of a GE network device 1226. The new FEC/PCS component 1223 may be coupled to a new GE optical module 1224 via a hot pluggable interface (e.g., a SFP interface) 1228. The new FEC/PCS component 1223 may be configured to implement the new FEC/PCS layer 920, including the functions of legacy PMA processing, legacy PCS (8b10b encoding/decoding) processing, and 64b66b and FEC encoding/decoding processing. For 64b66b line coding, the maximum consecutive identical digit (CID) may be equal to about 66 bits, while for legacy 8b10b line coding of GE, the maximum CID may be equal to about 5 bits. This means that the receiver (Rx) CID tolerance of the new GE optical module 1224 may be configured different from the legacy GE optical module 1214 due to the different maximum CID tolerance requirement. The new FEC/PCS component 1223 may also implement the data sending method 1000 and the data receiving method 1100.

Similar to the data sending/receiving system 1220, the data sending/receiving system 1230 may comprise a new FEC/PCS component 1233 that may be configured to implement the new FEC/PCS layer 920, the data sending method 1000, and the data receiving method 1100. However, unlike the new FEC/PCS component 1223, the new FEC/PCS component 1233 may be added or integrated in a new GE optical module 1234, which may be coupled to a legacy GE MAC/PHY chip 1232 in host PCB board of a GE network device 1236. The new GE optical module 1234 (that implements PMD) may be coupled to the legacy GE MAC/PHY chip 1232 via a hot pluggable interface (e.g., a SFP interface) 1238, and thus may be compatible with the legacy GE MAC/PHY chip 1232 in the host PCB board of a GE network device 1236. This may avoid substantial updating cost for network devices.

Figure 13:
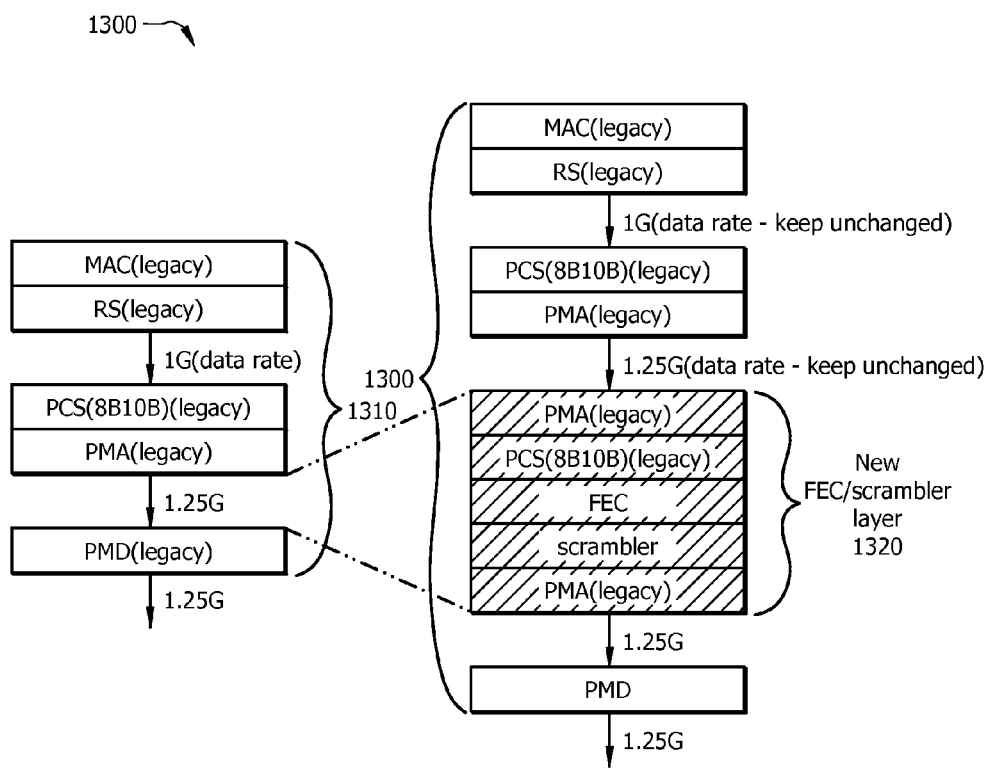
FIG. 13 is a schematic diagram of another embodiment of a GE data sending/receiving scheme with improved FEC.

FIG. 13 illustrates an embodiment of another GE data sending/receiving scheme 1300 with improved FEC capability. FIG. 13 also shows legacy standard GE protocol layers 1310, including MAC, RS, PCS (with 8b10b encoding/decoding), PMA, and PMD. The legacy GE protocol layers 1310 may be similar to the legacy GE protocol layers 910. The GE data sending/receiving scheme 1300 with improved FEC may comprise similar layers as the legacy standard GE protocol layers 1310. However, the GE data sending/receiving scheme 1300 may also comprise a new FEC/scrambler layer 1320 that may be added between the legacy PMA and PMD layers. The new FEC/scrambler layer 1320 may comprise a plurality of layers, including legacy PMA, legacy PCS (with 8b10b encoding/decoding), FEC, scrambler, and legacy PMA, arranged as shown in FIG. 13. In comparison to the new FEC/PCS layer 920, the new FEC/scrambler layer 1320 may comprise a scrambler instead of 64b66b line coding. Compared with about 3 percent overhead of 64b66b, the scrambler may not introduce any extra overhead. For the new FEC/scrambler layer 1320 to be compatible with legacy standard GE MAC/PHY devices/components, the 1.25 Gbps serialized data from legacy PMA may be first recovered, deserialized, and 8b10b decoded to identify SPD, EPD, data, idle deletion/insertion, and etc. The data may then be FEC encoded and scrambled, and the resulting FEC protected data may be serialized and forwarded to the PMD with the same 1.25 Gbps data rate as the legacy PMA data rate. Finally, the data may be transmitted in PMD. In the receiving direction, the processing procedure may be reversed.

Figure 14:
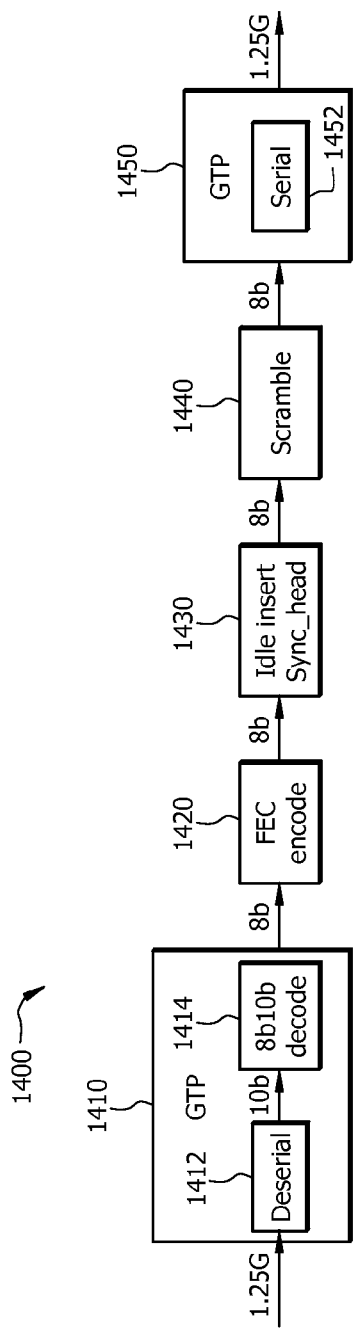
FIG. 14 is a schematic diagram of another embodiment of a data sending method.

FIG. 14 illustrates an embodiment of a data sending method 1400, which may be implemented at the new FEC/scrambler layer 1320. Initially, at a GTP 1410, the 1.25 G GE data received from legacy standard GE PMA may be deserialized at block 1412, byte synchronized, and 8b10b decoded at block 1414. The resulting output bytes stream may be FEC encoded at block 1420, undergo idle and synchronization header insertion at block 1430, and scrambled at block 1440. The resulting data may then be serialized at block 1452 and transmitted at a GTP 1450. In the data sending method 1400, idle insert and sync head (at block 1430) may be used to insert synchronization header in the front of each FEC code words, and insert an idle symbol to achieve rate matching.

Figure 15:
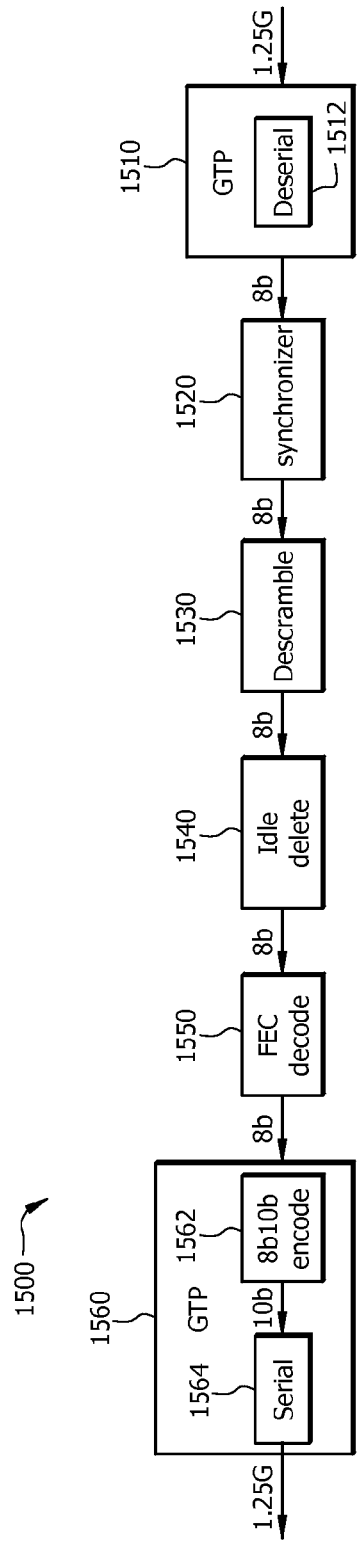
FIG. 15 is a schematic diagram of another embodiment of a data receiving method.

FIG. 15 illustrates an embodiment of a data receiving method 1500, which may be implemented at the new FEC/scrambler layer 1320. The data receiving method 1500 may be the reversed of the data transmission method 1400. Initially, at a GTP 1510, the received 1.25 G GE data with FEC coding may be deserialized at block 1512. The output may then be codeword synchronized for FEC at block 1520, and then descrambled at block 1530. Next, the data may be processed for idle deletion at block 1550, and then FEC decoded at block 1550. Subsequently, the data may be 8b10b encoded at block 1562 and then serialized at block 1564, at a GTP 1560. In the data receiving method 1500, a synchronizer (at block 1520) may be used to identify the first start byte of each FEC codeword.

Figure 16:
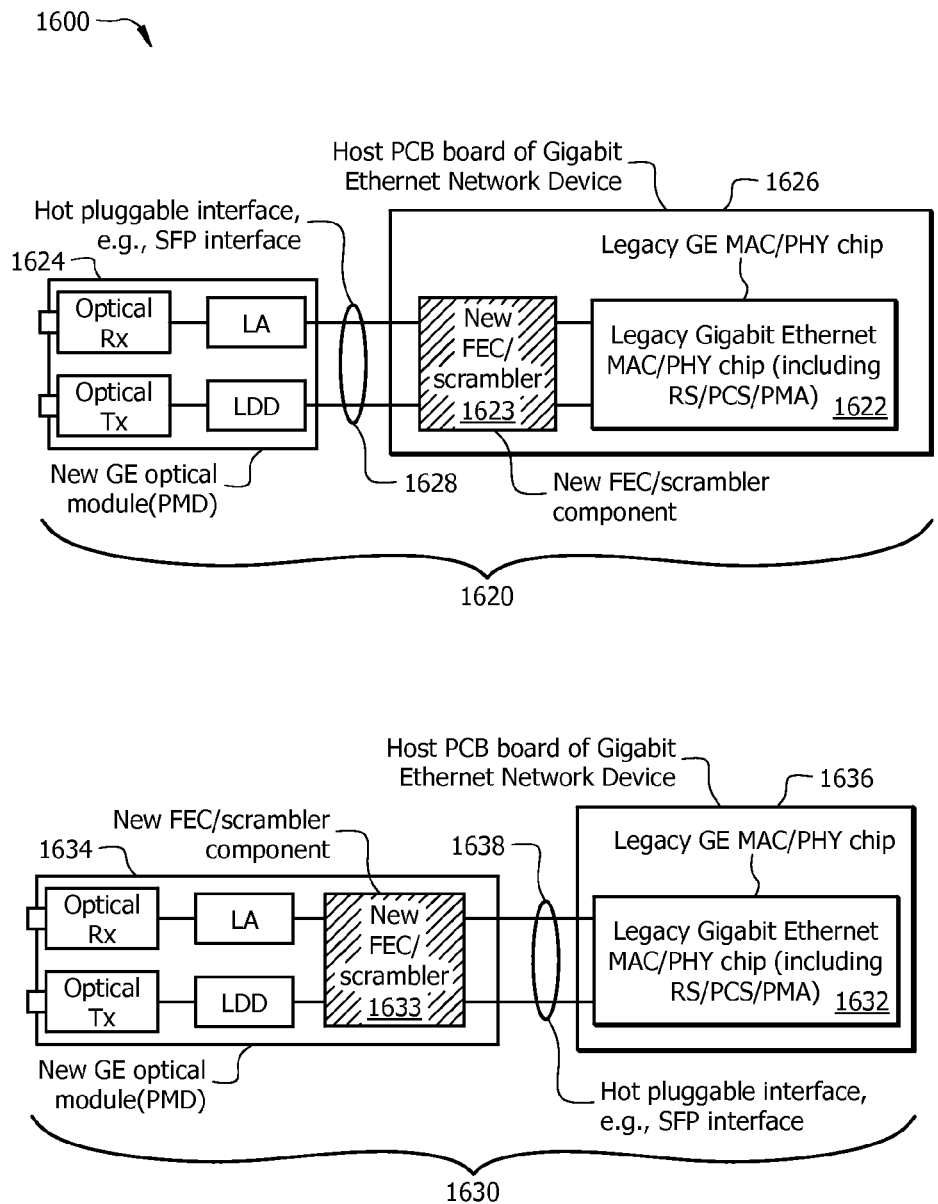
FIG. 16 is a schematic diagram of other apparatus embodiments according to the data sending/receiving scheme with improved FEC in FIG. 13, FIG. 14, and FIG. 15.

FIG. 16 illustrates embodiments of two data sending/receiving apparatuses 1620 and 1630 for implementing the GE data sending/receiving scheme 1300, the data sending method 1400, and the data receiving method 1500. In the data sending/receiving apparatus according to the data sending/receiving method 1300, a new FEC/scrambler component 1623 may be added and coupled to a legacy GE MAC/PHY chip 1622 in a host PCB board of a GE network device 1626. The new FEC/scrambler component 1623 may be coupled to a new GE optical module 1624 via a hot pluggable interface (e.g., a SFP interface) 1628. The new FEC/PCS component 1623 may be configured to implement the new FEC/scrambler layer 1320, including the functions of legacy PMA processing, legacy PCS (8b10b encoding/decoding) processing, FEC encoding/decoding, and scrambling/descrambling. For scrambling/descrambling, the maximum CID may be equal to about 72 bits, while for legacy 8b10b line coding of GE, the maximum CID may be equal to about 5 bits. This means that the receiver (Rx) CID tolerance of the new GE optical module 1624 may be configured different from a legacy GE optical module due to the different maximum CID tolerance requirement. The new FEC/PCS component 1623 may also implement the data sending method 1400 and the data receiving method 1500.

Similar to the data sending/receiving system 1620, the data sending/receiving system 1630 may comprise a new FEC/scrambler component 1633 that may be configured to implement the new FEC/scrambler layer 1320, the data sending method 1400, and the data receiving method 1500. However, unlike the data sending/receiving apparatus 1620, the new FEC/PCS component 1633 may be added or integrated in the new GE optical module 1634, which may be coupled to a legacy GE MAC/PHY chip 1632 in host PCB board of a GE network device 1636. The new GE optical module 1634 (that implements PMD) may be coupled to the legacy GE MAC/PHY chip 1632 via a hot pluggable interface (e.g., a SFP interface) 1638, and thus may be compatible with the legacy GE MAC/PHY chip 1632 in the host PCB board of a GE network device 1636. This may avoid substantial updating cost for network devices.

Figure 17:
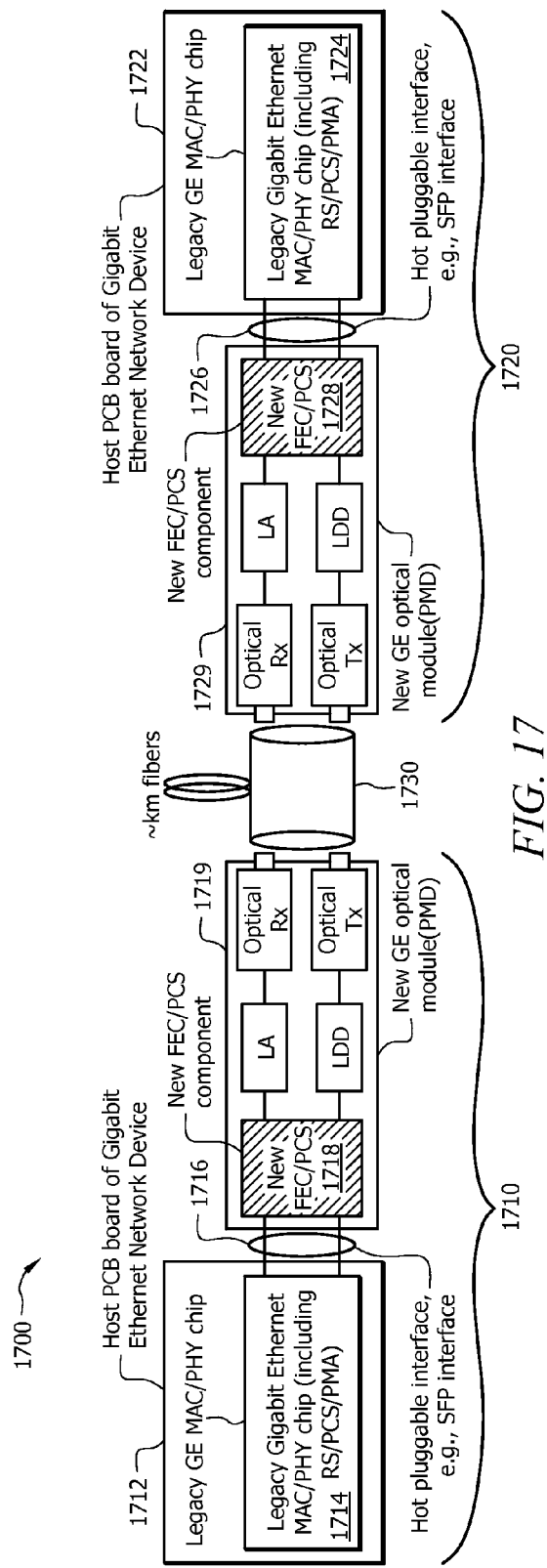
FIG. 17 is a schematic diagram of a P2P Ethernet transmission system.

FIG. 17 illustrates an embodiment of a P2P Ethernet transmission system 1700 that may be based on the GE data sending/receiving scheme 900 or 1300 and the related components and apparatus described above. From a first apparatus 1710 side (left side), the GE packets may be sent to from a legacy GE MAC/PHY chip 1714 in a host PCB board of Gigabit Ethernet network device 1712, via a hot pluggable interface 1716, to a new FEC/PCS component 1718 integrated in a GE optical module 1719. The GE packets may be 8b10b decoded and GMII to XGMII transformed, 64b66b encoded and FEC encoded, and then sent to a PMD component (comprising a LDD and optical transmitter (Tx)) via a PMA interface. The FEC protected GE packets with 64b66b encoded bits stream may be converted into an optical signal and transmitted by the optical Tx into optical fibers 1730.

At a second apparatus 1720 side, the optical signal of FEC protected GE packets may be detected by an optical Rx and converted into an electrical signal at a new GE optical module 1729. The restored electrical signal may be bit/byte/66 bits blocking synchronized, and the resulting 66 bits blocks stream may be FEC corrected and 64b66b decoded at a new FEC/PCS component 1728 in the new GE optical module 1729. Hence, the original 64 bits blocks may be restored. Based on the restored 64 bits block, the original GE packets may be restored after XGMII to GMII transformation, and subsequently the GE packets may be 8b10b encoded. Finally, the 8b10b encoded GE packets may be serialized and sent to a legacy Gigabit Ethernet MAC/PHY chip 1724 in a host PCB board of GE network device 1722, via a hot pluggable interface 1726. At the legacy Gigabit Ethernet MAC/PHY chip 1724, the GE packets may undergo further Ethernet protocol processing. GE packets may also be sent in the opposite direction from the second apparatus 1720 to the first apparatus 1710 and processed in a reverse.

Figure 18:
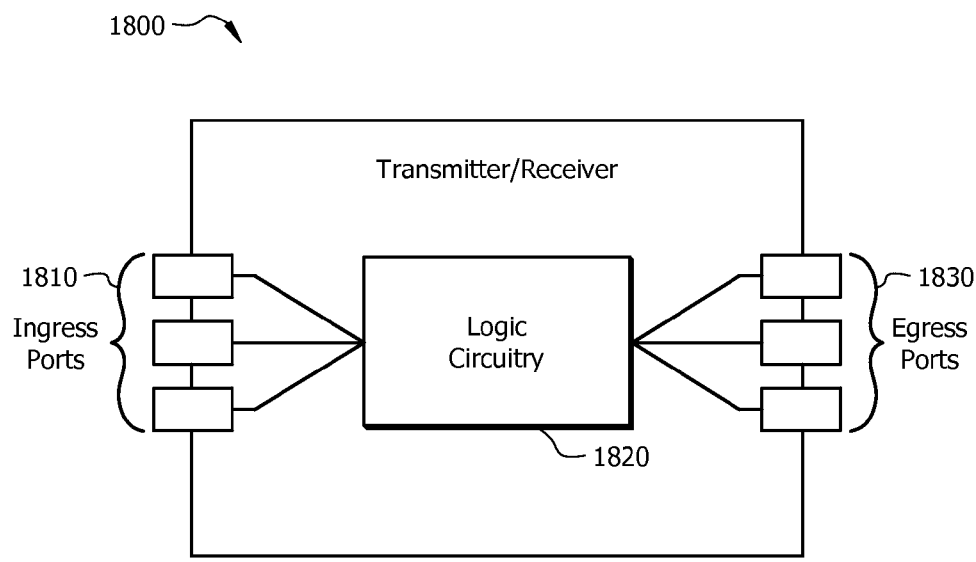
FIG. 18 is a schematic diagram of an embodiment of a network component unit.

FIG. 18 illustrates an embodiment of a transmitter/receiver unit 1800, which may be any device that transports packets through a network. For instance, the transmitter/receiver unit 1800 may be located at the OLT or the ONU and may be coupled to or comprise a GE optical module. The transmitted/receiver unit 1800 may comprise one or more ingress ports or units 1810 for receiving packets, objects, or TLVs from other network components, logic circuitry 1820 to determine which network components to send the packets to, and one or more egress ports or units 1830 for transmitting frames to the other network components.

Figure 19:
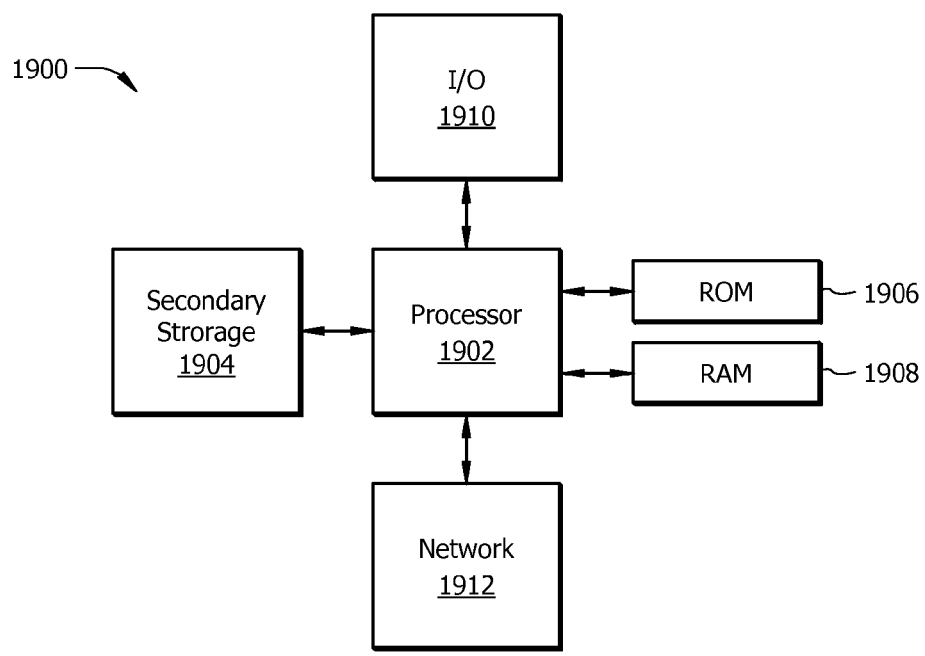
FIG. 19 is a schematic diagram of an embodiment of a general-purpose computer system.

The network components described above may be implemented on any general-purpose network component, such as a computer or network component with sufficient processing power, memory resources, and network throughput capability to handle the necessary workload placed upon it. FIG. 19 illustrates a typical, general-purpose network component 1900 suitable for implementing one or more embodiments of the components disclosed herein. The network component 1900 includes a processor 1902 (which may be referred to as a central processor unit or CPU) that is in communication with memory devices including second storage 1804, read only memory (ROM) 1906, random access memory (RAM) 1908, input/output (I/O) devices 1910, and network connectivity devices 1912. The processor 1902 may be implemented as one or more CPU chips, or may be part of one or more application specific integrated circuits (ASICs).

The second storage 1904 is typically comprised of one or more disk drives or tape drives and is used for non-volatile storage of data and as an over-flow data storage device if RAM 1908 is not large enough to hold all working data. Second storage 1904 may be used to store programs that are loaded into RAM 1908 when such programs are selected for execution. The ROM 1906 is used to store instructions and perhaps data that are read during program execution. ROM 1906 is a non-volatile memory device that typically has a small memory capacity relative to the larger memory capacity of second storage 1904. The RAM 1908 is used to store volatile data and perhaps to store instructions. Access to both ROM 1906 and RAM 1708 is typically faster than to second storage 1904.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 7 percent, . . . , 70 percent, 71 percent, 72 percent, . . . , 97 percent, 96 percent, 97 percent, 98 percent, 99 percent, or 100 percent. Moreover, any numerical range defined by two R numbers as defined in the above is also specifically disclosed. Use of the term "optionally" with respect to any element of a claim means that the element is required, or alternatively, the element is not required, both alternatives being within the scope of the claim. Use of broader terms such as comprises, includes, and having should be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A method for sending data from a transmitter to a receiver in a transmission network comprising:
   receiving outgoing data that is eight-bits-ten-bits (8b10b) encoded at a line rate from a physical medium attachment (PMA) layer;
   8b10b decoding the received outgoing data;
   64-bits-to-66-bits (64b66b) encoding the 8b10b decoded outgoing data;
   forward error correction (FEC) encoding the 64b66b encoded outgoing data; and
   serializing and sending the 64b66b and FEC encoded outgoing data at the line rate to a physical medium dependent (PMD) layer.

2. The method of claim 1, wherein the line rate is equal to about 1.25 Gigabits per second (Gbps).

3. The method of claim 1 further comprising:
   deserializing and byte synchronizing the outgoing data from the PMA layer before 8b10b decoding;
   ten Gigabit media independent interface (XGMII) transforming the 8b10b decoded outgoing data;
   inserting idle into the XGMII transformed outgoing data to match the line rate before 64b66b encoding;
   assembling one FEC payload from a plurality of 66 bits blocks created from the 64b66b encoding;
   feeding the FEC payload into a FEC encoder for parity generation to obtain a plurality of parity symbols;
   appending the parity symbols to the end of a payload of the outgoing data to form a FEC codeword; and
   bit width transforming the FEC codeword from 66 bits width to eight bits width before serializing and sending the outgoing data to the PMD layer.

4. The method of claim 3 further comprising using systematic Reed-Solomon (RS) FEC coding to obtain the FEC encoded outgoing data.

5. The method of claim 1, wherein the line rate is one of a Gigabit Ethernet (GE) line rate, a 10 GE line rate, and a Fast Ethernet (FE) line rate.

6. A method for sending data from a transmitter to a receiver in a transmission network comprising:
   receiving outgoing data that is eight-bits-ten-bits (8b10b) encoded at a line rate from a physical medium attachment (PMA) layer;
   8b10b decoding the received outgoing data;
   forward error correction (FEC) encoding the 8b10b decoded outgoing data;
   scrambling the FEC encoded outgoing data; and
   serializing and sending the FEC and scramble encoded outgoing data at the line rate to a physical medium dependent (PMD) layer.

7. The method of claim 6, wherein the line rate is equal to about 1.25 Gigabits per second (Gbps).

8. The method of claim 6 further comprising:
   inserting idle into the FEC encoded outgoing data to match the line rate before scrambling the outgoing data;
   inserting synchronization header to the FEC encoded outgoing data for FEC codeword synchronization; and using systematic Reed-Solomon (RS) FEC coding to obtain the FEC encoded outgoing data.

9. The method of claim 6, wherein the line rate is one of a Gigabit Ethernet (GE) line rate, a 10 GE line rate, and a Fast Ethernet (FE) line rate.

10. A network component of a physical coding sub-layer comprising:
one or more processing blocks configured to:
receive outgoing data with a first line coding at a first data rate via a physical medium attachment (PMA) interface;
decode the outgoing data at the first line coding to create decoded outgoing data;
encode the decoded outgoing data with a forward error correction (FEC) coding and a second line coding that has lower redundancy than the first line coding to create encoded outgoing data; and
transmit the encoded outgoing data with the FEC coding and the second line coding at the same first data rate to a physical medium dependent (PMD) component via the PMA interface.

11. The network component of claim 10, wherein the one or more processing blocks are further configured to:
receive incoming data with the first data rate, the second line coding, and the FEC coding from the PMD component via the PMA interface;
decode the incoming data at the FEC coding and the second line coding;
encode the decoded incoming data with the first line coding that has higher redundancy than the second line encoding; and
transmit the incoming data with first line coding at the first data rate to a PMA component via the PMA interface.

12. The network component of claim 10, wherein encoding and decoding the outgoing and incoming data with the FEC coding and the second line coding are transparent to a higher media access control (MAC) layer.

13. The network component of claim 10, wherein the first line coding is an eight-bits-ten-bits (8b10b) line coding, the second line coding is a 64-bits-to-66-bits (64b66b) line coding, and wherein both the first data rate and the second data rate correspond to 1.25 Gigabits per second (Gbps).

14. The network component of claim 10, wherein the first line coding is an eight-bits-ten-bits (8b10b) line coding, and the second line coding is scrambling, and wherein both the first data rate and the second data rate correspond to 1.25 Gigabits per second (Gbps).

15. The network component of claim 10, wherein the FEC coding is systematic Reed-Solomon (RS) FEC coding.

16. The network component of claim 10, wherein using FEC and the second line coding improves link quality and reduces communication errors without sacrificing data payload bandwidth and without using higher cost lasers.

17. A point-to-point (P2P) transmission apparatus comprising:
a host device comprising a plurality of components for Media Access Control (MAC), reconciliation (RS), physical coding sub-layer (PCS), and physical medium attachment (PMA) functions, link establishment, management, and monitoring function, and related services configuration functions; and
a forward error correction (FEC)/PCS component comprising one or more processing units configured to:
receive outgoing data from the host device with a first line coding at a first data rate via a PMA interface coupled to the host device;
decode the outgoing data at the first line coding to create decoded outgoing data;
encode the decoded outgoing data with a FEC coding and a second line coding that has lower redundancy than the first line coding to create encoded outgoing data;
transmit the encoded outgoing data with the FEC coding and the second line coding at the same first data rate to a physical medium dependent (PMD) component via the PMA interface;
receive incoming data with the first data rate, the second line coding, and the FEC coding from the PMD component via the PMA interface;
decode the incoming data at the FEC coding and the second line coding;
encode the decoded incoming data with the first line coding that has higher redundancy than the second line encoding; and
transmit the incoming data with first line coding at the first data rate to a PMA component via the PMA interface.

18. The P2P transmission apparatus of claim 17, wherein encoding and decoding the outgoing and incoming data with the FEC coding and the second line coding are transparent to a higher media access control (MAC) layer.

19. The P2P transmission apparatus of claim 17, wherein the first line coding is an eight-bits-ten-bits (8b10b) line coding, the second line coding is a 64-bits-to-66-bits (64b66b) line coding, and wherein both the first data rate and the second data rate correspond to 1.25 Gigabits per second (Gbps).

20. The P2P transmission apparatus of claim 17, wherein the first line coding is an eight-bits-ten-bits (8b10b) line coding, and the second line coding is scrambling, and wherein both the first data rate and the second data rate correspond to 1.25 Gigabits per second (Gbps).

21. The P2P transmission apparatus of claim 17, wherein the FEC coding is systematic Reed-Solomon (RS) FEC coding.

22. The P2P transmission apparatus of claim 17 further comprising a PMD transmitter and receiver and a plurality of related accessory circuits.

23. The P2P transmission apparatus of claim 22, wherein the host device and the FEC/PCS component are interfaced according to a GE PMA specification, and wherein the FEC/PCS component and the PMD transmitter and receiver are also interfaced according to the GE PMA specification.

* * * * *

UNITED STATES PATENT AND TRADEMARK OFFICE
CERTIFICATE OF CORRECTION

PATENT NO. : 8,738,988 B2
APPLICATION NO. : 13/169476
DATED : May 27, 2014
INVENTOR(S) : Huafeng Lin et al.

It is certified that error appears in the above-identified patent and that said Letters Patent is hereby corrected as shown below:

In the claims:

Column 17, Lines 21-33, Claim 11, should read as:
"11. The network component of claim 10, wherein the one or more processing blocks are further configured to:
receive incoming data with the first data rate, the second line coding, and the FEC coding from the PMD component via the PMA interface;
decode the incoming data at the FEC coding and the second line coding;
encode the decoded incoming data with the first line coding that has higher redundancy than the second line encoding; and
transmit the incoming data with the first line coding at the first data rate to a PMA component via the PMA interface."

Column 17, Lines 54, through Column 18, Lines 1-30, Claim 17, should read as:
"17. A point-to-point (P2P) transmission apparatus comprising:
a host device comprising a plurality of components for Media Access Control (MAC), reconciliation (RS), physical coding sub-layer (PCS), and physical medium attachment (PMA) functions, link establishment, management, and monitoring function, and related services configuration functions; and
a forward error correction (FEC)/PCS component comprising one or more processing units configured to:
receive outgoing data from the host device with a first line coding at a first data rate via a PMA interface coupled to the host device;
decode the outgoing data at the first line coding to create decoded outgoing data;
encode the decoded outgoing data with a FEC coding and a second line coding that has lower redundancy than the first line coding to create encoded outgoing data;
transmit the encoded outgoing data with the FEC coding and the second line coding at the same first data rate to a physical medium dependent (PMD) component via the PMA interface;

Signed and Sealed this
Eleventh Day of November, 2014

Michelle K. Lee
*Deputy Director of the United States Patent and Trademark Office*

CERTIFICATE OF CORRECTION (continued)
U.S. Pat. No. 8,738,988 B2 receive incoming data with the first data rate, the second line coding, and the FEC coding from the PMD component via the PMA interface;
    decode the incoming data at the FEC coding and the second line coding;
    encode the decoded incoming data with the first line coding that has higher redundancy than the second line encoding; and
    transmit the incoming data with the first line coding at the first data rate to a PMA component via the PMA interface."

Column 18, Lines 51-55, Claim 23, should read as:
"23. The P2P transmission apparatus of claim 22, wherein the host device and the FEC/PCS component are interfaced according to a Gigabit Ethernet (GE) PMA specification, and wherein the FEC/PCS component and the PMD transmitter and receiver are also interfaced according to the GE PMA specification."